United States Patent
Ramamurthy

(10) Patent No.: US 11,588,471 B1
(45) Date of Patent: Feb. 21, 2023

(54) SAMPLE-AND-HOLD, LOOP-BASED SCHEMES WITH DAMPING CONTROL FOR SATURATION RECOVERY IN AMPLIFIERS

(71) Applicant: TEXAS INSTRUMENTS INCORPORATED, Dallas, TX (US)

(72) Inventor: Venkata Ramanan Ramamurthy, Bangalore (IN)

(73) Assignee: Texas Instruments Incorporated, Dallas, TX (US)

(*) Notice: Subject to any disclaimer, the term of this patent is extended or adjusted under 35 U.S.C. 154(b) by 0 days.

(21) Appl. No.: 17/705,647

(22) Filed: Mar. 28, 2022

(51) Int. Cl.
H03F 3/217 (2006.01)
H03H 11/02 (2006.01)

(52) U.S. Cl.
CPC ............ *H03H 11/02* (2013.01); *H03F 3/217* (2013.01)

(58) Field of Classification Search
CPC ...................................... H03F 3/217
USPC ................. 327/552; 330/10, 207 A, 251
See application file for complete search history.

(56) References Cited

U.S. PATENT DOCUMENTS

| | | | |
|---|---|---|---|
| 7,038,535 B2 | 5/2006 | Lee | |
| 2004/0189377 A1* | 9/2004 | Lee | H03F 3/217 330/10 |
| 2018/0337644 A1* | 11/2018 | Sundar | H03F 3/45475 |

* cited by examiner

*Primary Examiner* — William Hernandez
(74) *Attorney, Agent, or Firm* — Valerie M. Davis; Frank D. Cimino

(57) ABSTRACT

Examples of amplifiers and $n^{th}$-order loop filters thereof are configured to enable fast and robust recovery from saturation, while limiting signal distortion at or near full power delivery across multiple process and temperature corners. An example $n^{th}$-order loop filter comprises n series-coupled resistor-capacitor (RC) integrators. In an example, each of the second RC integrator to the $(n-1)^{th}$ RC integrator has a reset mechanism responsive to a reset signal output from a reset controller when an input signal overload condition is detected at the input. Upon detecting the overload condition, each of the third RC integrator to the $(n-1)^{th}$ RC integrator is hard reset, the $n^{th}$ RC integrator is not reset, and a controlled reset is performed on the second RC integrator to recover from saturation caused by the signal overload condition, while maintaining the output signal below the 1% total harmonic distortion (THD) level at or near full power delivery.

19 Claims, 6 Drawing Sheets

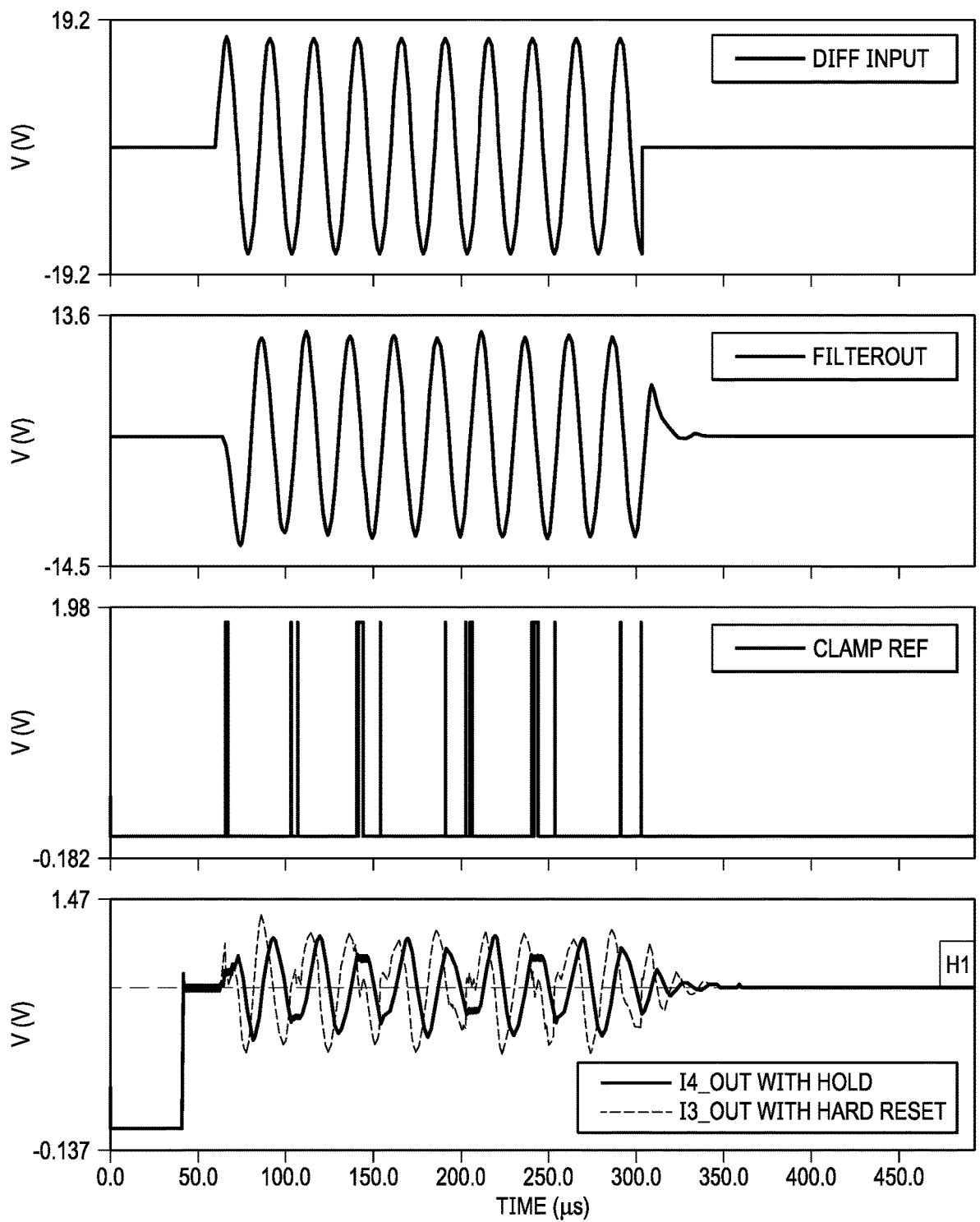

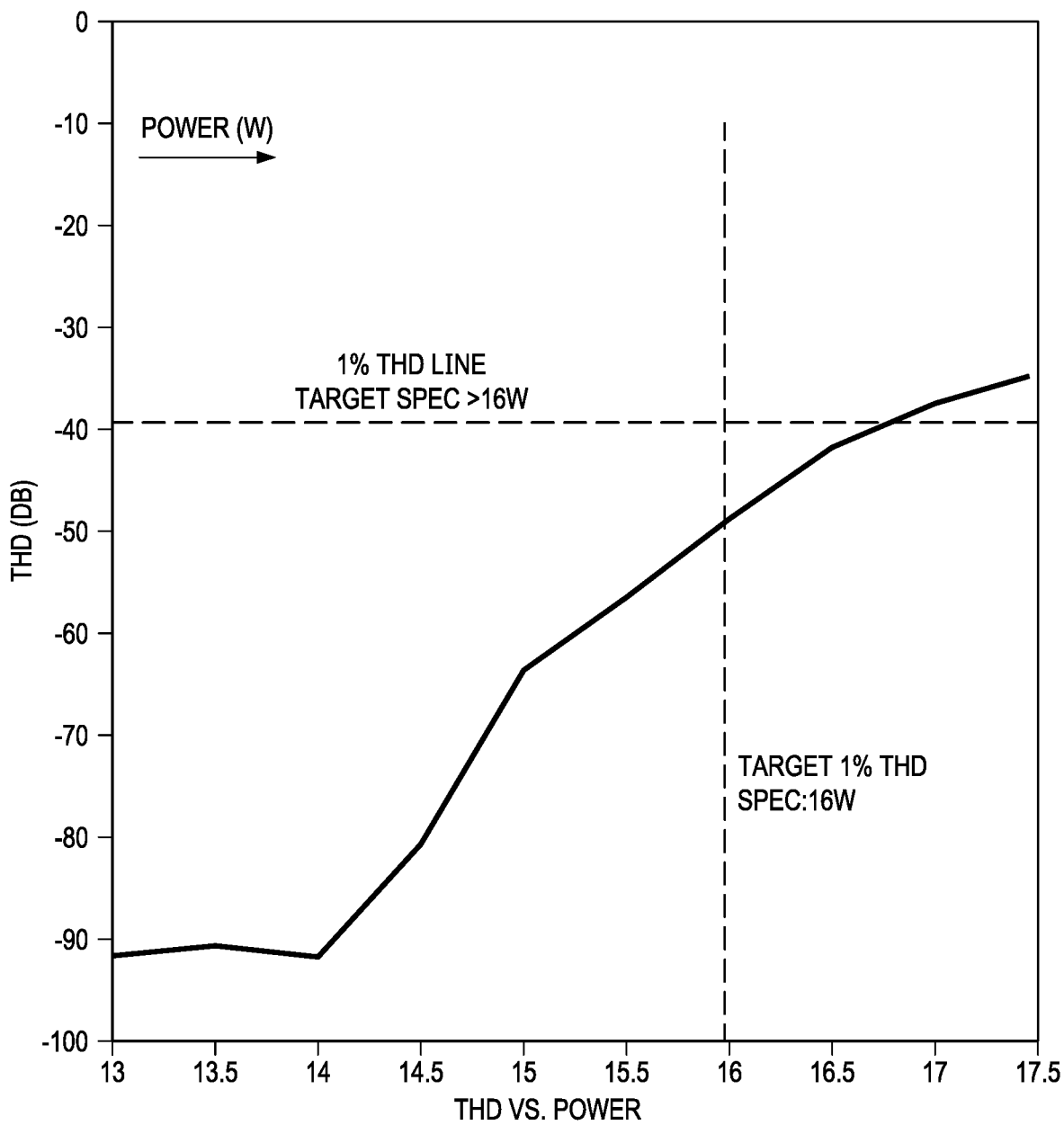

SAMPLE-AND-HOLD, LOOP-BASED SCHEMES WITH DAMPING CONTROL FOR SATURATION RECOVERY IN AMPLIFIERS

FIELD OF DISCLOSURE

This disclosure relates to recovery from saturation in amplifiers, particularly Class D amplifiers, while limiting output signal distortion at or near full power delivery, and more particularly to fast and robust saturation recovery in amplifiers across multiple process and temperature corners while the output signal remains below the 1% total harmonic distortion (THD) level at or near full power delivery.

BACKGROUND

In an audio Class D amplifier overloading input signals with maximum power (0 dB relative to full scale) at, for example, 20 kHz-40 kHz, may lead to saturation of the loop filter in the amplifier. When overloaded, the transfer function of the loop filter becomes very non-linear, and even when the overloading input signals are removed, the loop filter may not readily, if ever, recover. That is, overloading may cause the loop filter, and hence the amplifier, to remain in a saturated oscillatory state for a long period of time.

One previous approach to solving this issue involves employing current sources coupled to the output of a comparator that outputs a logic high signal when the inputs to the comparator indicate overloading. In response to the logic high signal, the current sources inject recovery current(s) into the virtual terminal(s) of integrator(s) in the loop filter to discharge the integrating capacitor(s) of the integrator(s) to damp or prevent oscillations of the loop filter output. To work, each integrator into which recovery current is injected needs to be in the linear operating region. This approach also assumes that all integrating capacitors are charged in the same direction during the point of injection, but this assumption does not always hold, in which case the injected current(s) may charge instead of discharge the capacitor(s). Overall, this approach is not robust enough to stop all oscillations; sustained oscillations remain certain process/temperature corners.

Another previous approach to solving the loop filter saturation recovery issue involves a hard reset of all integrators downstream from either a first or a second integrator. A switch is coupled to each downstream integrator. In this approach, a logic high output of the comparator, indicating overloading, turns on (closes) the switches to discharge the associated integrating capacitors. While this approach is more effective in discharging the integrating capacitors, the output signal is still well above the 1% THD threshold. The deviation is quite large and unacceptable.

A third previous approach to solving the loop filter saturation recovery issue involves a hard reset on all integrators downstream from the third integrator. While this improves THD at full power, as compared with the previous approaches discussed above, the 1% THD threshold is still not met, and thus this approach is still not good enough.

Thus, a better solution to the loop filter saturation recovery issue is desired.

SUMMARY

In an example, an $n^{th}$-order loop filter comprises an input configured to receive an input signal; and n resistor-capacitor (RC) integrators coupled in series, the second of the n RC integrators having a first type of reset mechanism, and each of the third RC integrator to the $(n-1)^{th}$ RC integrator of the n RC integrators having a second type of reset mechanism, where n is an integer of 4 or greater. The $n^{th}$-order loop filter also comprises a reset controller configured to output a reset signal to each of the first and second types of reset mechanisms when an overload condition is detected at the input.

In an example, an amplifier comprises a loop filter and a reset controller. The loop filter includes a first resistor-capacitor (RC) integrator having an input and an output, the input configured to receive an input signal; a second RC integrator having an input and an output, the input of the second RC integrator coupled to the output of the first RC integrator; a third RC integrator having an input and an output, the input of the third RC integrator coupled to the output of the second RC integrator; a last RC integrator having an input and an output, the input of the last RC integrator coupled to an output of a second-to-last RC integrator; a damping control mechanism coupled between the input and the output of the second RC integrator; and reset mechanisms coupled between the input and the output of the third RC integrator to the second-to-last RC integrator, respectively. The reset controller is configured to output a reset signal to the damping control mechanism and to the reset mechanisms when an overload condition is detected.

In an example, a method of recovering from saturation in an $n^{th}$-order loop filter comprises resetting each of a third resistor-capacitor (RC) integrator to an $(n-1)^{th}$ RC integrator of n series-coupled RC integrators in the $n^{th}$-order loop filter; maintaining an $n^{th}$ RC integrator of the n series-coupled RC integrators in a hold state; and performing a controlled reset on a second RC integrator of the n series-coupled RC integrators. Integer n is 4 or greater.

In example, a method recovering from saturation in an $n^{th}$-order loop filter comprises closing a switch of a second resistor-capacitor (RC) integrator of n series-coupled RC integrators in the $n^{th}$-order loop filter to create a resistive circuit path in parallel with an integrating capacitor of the second RC integrator; closing a switch of each of a third RC integrator to an $(n-1)^{th}$ RC integrator of the n series-coupled RC integrators to create a short circuit path in parallel with an integrating capacitor of each of the third to the $(n-1)^{th}$ RC integrator; and performing a hold operation on an $n^{th}$ RC integrator of the n series-coupled RC integrators. Integer n is 4 or greater.

These and other features will be better understood from the following detailed description with reference to the accompanying drawings.

BRIEF DESCRIPTION OF THE DRAWINGS

Features of the disclosure may be understood from the following figures taken in conjunction with the detailed description.

FIG. 4A are graphs of various signals in an example saturation recovery scheme applied to an example $n^{th}$-order loop filter in an example amplifier when overloaded and the overloading signal is released to an idle channel.

FIG. 4B is a graph of THD vs. Power of the output signal for the example saturation recovery scheme of FIG. 4A.

DETAILED DESCRIPTION

Figure 1:
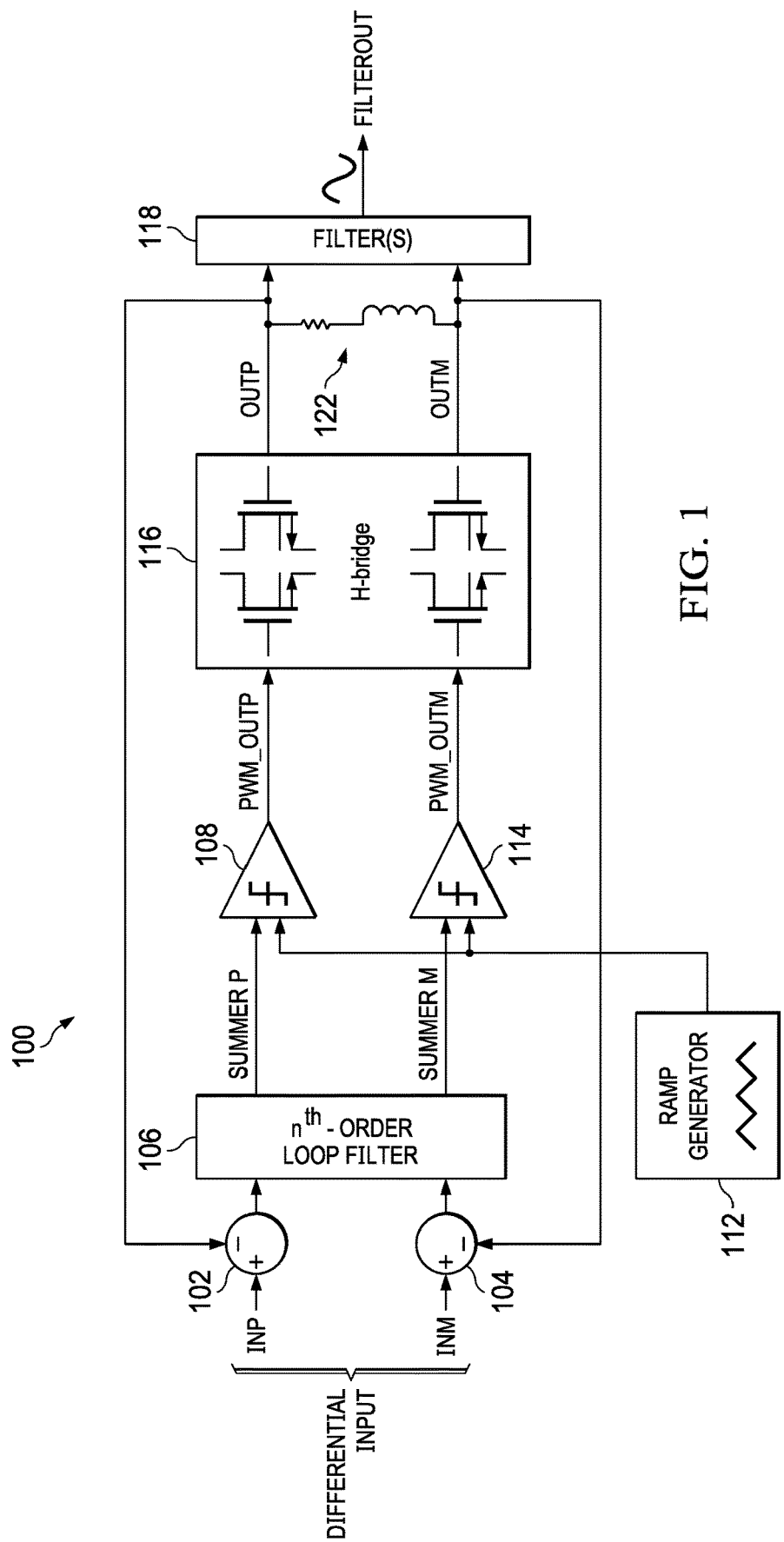
FIG. 1 is a diagram of an example amplifier, such as a Class D amplifier.

Specific examples are described below in detail with reference to the accompanying figures. These examples are not intended to be limiting. In the drawings, corresponding numerals and symbols generally refer to corresponding parts unless otherwise indicated. The objects depicted in the drawings are not necessarily drawn to scale.

FIG. 1 is a diagram of example Class D amplifier 100, which receives a differential input signal. A pair of subtractors 102 and 104 subtract differential output components OUTP and OUTM from differential input components INP and INM, respectively. The resulting signals output from subtractors 102 and 104 are provided to an $n^{th}$-order loop filter (or simply loop filter) 106, where n is an integer of 3 or greater. In an example, n is 4. Each component of the differential signal input to loop filter 106 may be integrated over an $n^{th}$-order integration function comprised of a chain of n integrators coupled in series. The outputs of each of the n integrators are used to generate, via summers within loop filter 106, signals SUMMER P and SUMMER M.

The SUMMER P signal is input to a comparator 108 that also receives a signal from a ramp generator 112. The output of ramp generator 112 may be a triangular carrier signal, among other types of signals. Comparator 108 compares the ramp generated signal with SUMMER P to generate a first pulse width modulated (PWM) signal PWM_OUTP. The SUMMER M signal is input to comparator 114 that also receives the ramp generator signal. Based on a comparison of the two input signals, comparator 114 generates a second PWM signal, namely, PWM_OUTM.

PWM_OUTP and PWM_OUTM are used to drive a switching output stage, which may be in the form of H-bridge 116. The outputs of H-bridge 116 (OUTP and OUTM), are input to downstream filter(s) 118, in addition to being fed back to subtractors 102 and 104, respectively. An inductor-resistor (LR) series circuit 122, which models an audio speaker, is coupled between the outputs of H-bridge 116. The output of filter(s) 118, which is also the output of amplifier 100, is denoted FILTEROUT.

Figure 2:
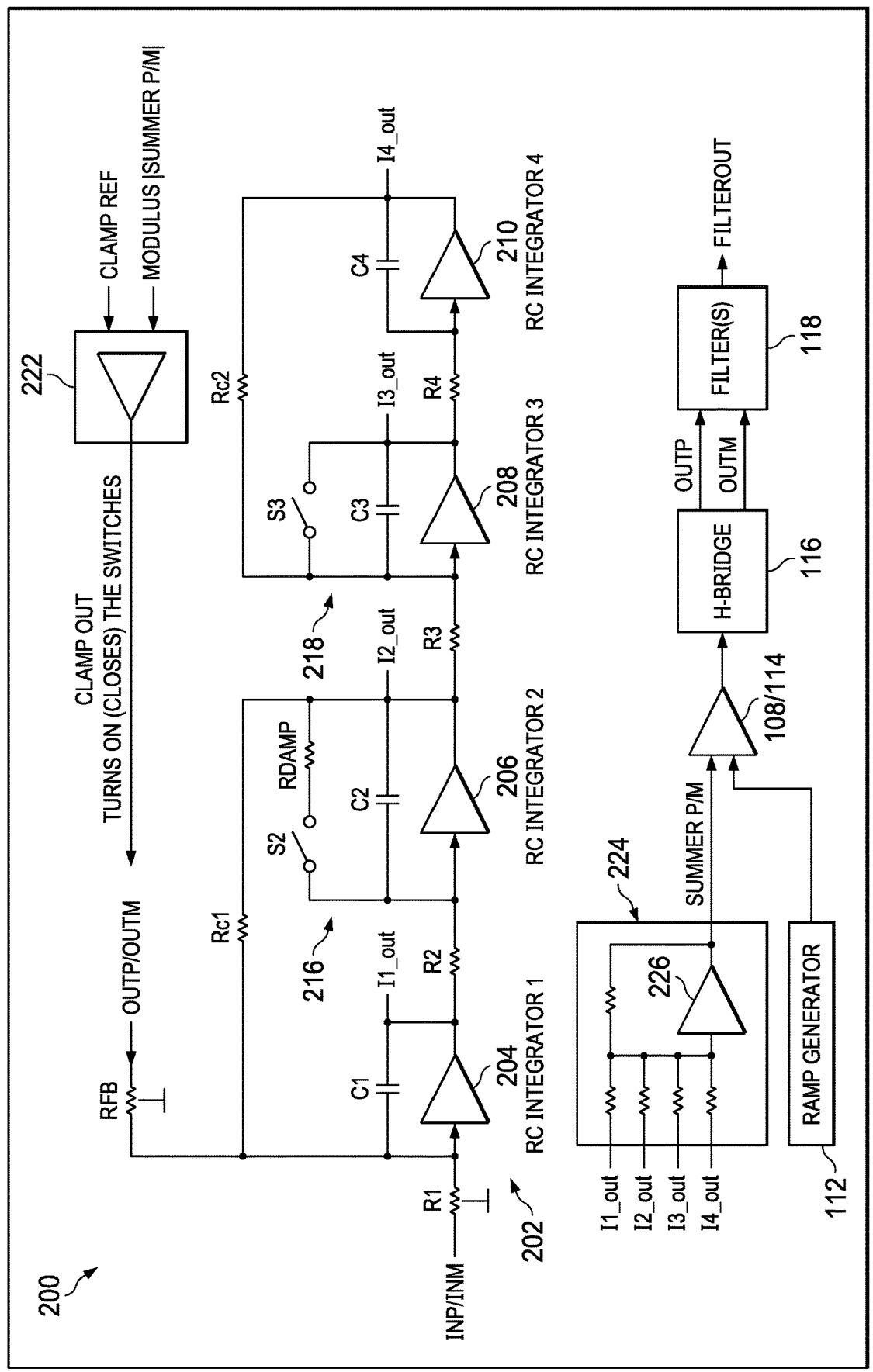
FIG. 2 is an example $n^{th}$-order loop filter, along with other components of an example amplifier, such as a Class D amplifier.

To improve recovery from saturation without degrading 1% THD of signals at or near delivery of full power, loop filter 106 may be configured as shown in FIG. 2. Saturation may be caused by an overload condition, which may include input signal overloading, i.e., a differential input signal with maximum power (0 dB relative to full scale) at, for example, approximately 20 kHz to approximately 40 kHz. The input signal may be in the range of audio frequency (approximately 20-20 kHz), as well as in the ultrasonic frequency range (approximately 20 kHz-40 kHz). Overloading is much more likely at higher frequencies, such as in the ultrasonic frequency range.

FIG. 2 is a diagram of example $n^{th}$-order loop filter (loop filter) 200 that is configured to enable resetting of select resistor-capacitor (RC) integrators, while preventing resetting of one or more other RC integrators. Such selective resetting, in which some RC integrators are hard reset while another RC integrator is soft reset (or reset in a controlled manner), may be used to create a sample-and-hold function at the output of the soft reset RC integrator. Selective and controlled reset enables loop filter 200 to recover from saturation faster while satisfying the 1% THD in the output signal.

In the example of FIG. 2, loop filter 200 is a $4^{th}$-order loop filter, having a chain of four (4) series-coupled, resistor-capacitor (RC) integrators 202. RC integrator 1 comprises a main integration component 204, an input resistor R1, and an integrating capacitor C1. RC integrator 1 has an input configured to receive a differential signal component, i.e., either INP—feedback signals or INM—feedback signals, where the INP/INM component is received via input resistor R1 and a first of the feedback signals OUTP/OUTM component is received via a feedback resistor RFB and a second of the feedback signals is received from the output of a downstream RC integrator of chain 202. Integrating capacitor C1 is coupled across an input and output of main integration component 204, which is also the output of RC integrator 1. The output signal of RC integrator 1 is denoted I1_out. The other RC integrators are similarly constructed.

RC integrator 2 has an input at the receiving end of resistor R2, which input is coupled to the output of RC integrator 1. Integrating capacitor C2 of RC integrator 2 is coupled across an input and output of main integration component 206 of RC integrator 2, which is also the output of RC integrator 2. The output signal of RC integrator 2 is denoted I2_out. A resistor Rc1 is coupled across the input of main integration component 204 and the output of main integration component 206, which forms the feedback path for the second feedback signal.

RC integrator 3 has an input at the receiving end of resistor R3, which input is coupled to the output of RC integrator 2. Integrating capacitor C3 of RC integrator 3 is coupled across an input and output of main integration component 208 of RC integrator 3, which is also the output of RC integrator 3. The output signal of RC integrator 3 is denoted I3_out.

RC integrator 4 has an input at the receiving end of resistor R4, which input is coupled to the output of RC integrator 3. Integrating capacitor C4 of RC integrator 4 is coupled across an input and output of main integration component 210 of RC integrator 4, which is also the output of RC integrator 4. The output signal of RC integrator 4 is denoted I4_out. A resistor Rc2 is coupled across the input of main integration component 208 and the output of main integration component 210, such that some of the output signal of RC integrator 4 is fed back to the input of main integration component 208.

Reset mechanisms 216 and 218 are associated with RC integrators 2 and 3, respectively. Reset mechanisms 216 and 218 are coupled in parallel with integrating capacitors C2 and C3, respectively, as well as across the input and output of main integration components 206 and 208, respectively. Reset mechanism 216 is an example of controlled reset mechanism, and reset mechanism 218 is an example of a hard reset mechanism.

In an example, reset mechanisms 216 and 218 are configured as follows. Reset mechanism 216 includes a switch S2 and a resistor RDAMP coupled in series, and collectively coupled in parallel with integrating capacitor C2. RDAMP may be programmable within a range of, for example, 100 kΩ to 1000 kΩ. In an example, RDAMP is 400 kΩ. Reset mechanism 218 includes a switch S3 and associated wiring with negligible resistance. If a reset mechanism is included for RC integrator 4, it may be in the form of a switch and a programmable resistance component, but to get RC integrator 4 to a hold state, the associated switch is kept open. The resistance values of R1-R4 and the capacitance values of C1-C4 are set such that the transfer function of loop filter 200 is achieved as desired. The resistance values of Rc1 and Rc2 determine the resonator pole in the loop transfer function.

Switches S2 and S3 are turned on (closed) in response to a clamp out signal outputted by a comparator 222, which is an example of a reset controller. The clamp out signal is an example of a reset signal. Comparator 222 has a clamp reference input and a modulus input. The clamp reference input is configured to receive a clamp reference signal that is indicative of an overloading condition. The clamp reference signal may be a voltage signal that is certain threshold, e.g., 100 mV, over the peak voltage of the ramp generator signal (e.g., the output of ramp generator 112. The modulus input is configured to receive a signal representative of the absolute value of the output (SUMMER P/M) of a summer circuit 224 that sums the outputs of RC integrators 204, 206, 208 and 210. Comparator 222 compares the clamp reference signal with |SUMMER P/M|, and when |SUMMER P/M| is the greater of the two, comparator 222 outputs a clamp out signal, which may be a logic high, e.g., "1", signal to close switches S2 and S3.

Summer circuit 224 includes n (e.g., 4) inputs coupled to outputs of the n RC integrators (e.g., RC integrators 1, 2, 3 and 4) to receive n output signals (e.g., I1_out, I2_out, I3_out and I4_out), respectively. Each RC integrator output signal is fed into an input of a summer component 226 via a corresponding resistor of suitable resistance given the desired transfer function. Summer 224 also includes a resistive feedback path from the output of summer component 226 and its input. The resistance of that feedback path is also set based on the desired transfer function.

Summer circuit 224 generates a summed signal, e.g., SUMMER P/M, which, in turn, is input to a comparator 108/114. Series-coupled, resistor-capacitor (RC) integrators 202 is a differential circuit; single-ended is shown for ease of representation. Comparator 108 receives SUMMER P and the ramp generated signal from ramp generator 112 to generate PWM_OUTP that is input to H-bridge 116, and comparator 114 receives SUMMER M and the ramp generated signal to generate PWM_OUTM that is input to H-bridge 116.

Figure 3:
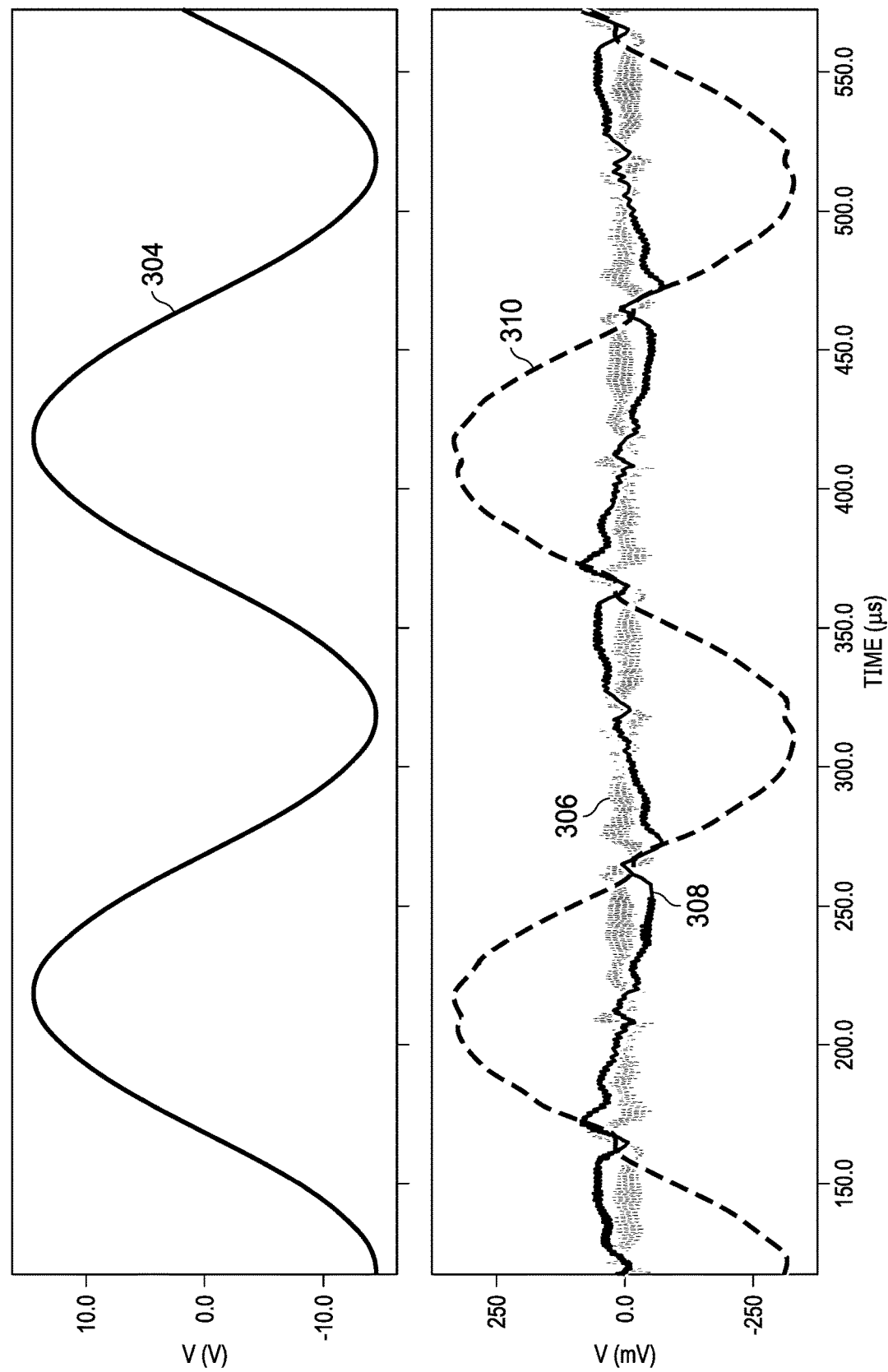
FIG. 3 are graphs of an example output signal of a Class D amplifier, as well signals resulting from specific RC integrators, respectively, of an example $n^{th}$-order loop filter, such as that shown in FIG. 2, when the input is not overloading and saturation recovery has not begun.

FIG. 3 are graphs of an example output signal of a Class D amplifier, as well as signals from specific RC integrators, respectively, when an example hybrid sample-and-hold based integrator reset scheme is applied to example $4^{th}$-order loop filter 200, when the input is not overloading and saturation recovery has not yet begun. The resulting FILTEROUT waveform (voltage overtime) is identified by reference numeral 304. As can be seen, FILTEROUT is heavily controlled by the output of RC integrator 4 (I4_out), as shown by the waveform 310. A hard reset is performed on RC integrator 3 for a sampling operation at the output of RC integrator 2, and a controlled reset is performed on RC integrator 2 for damping control. The output of RC integrator 2 (I2_out) is waveform 306, and the output of RC integrator 3 (I3_out) is waveform 308. In this example scheme, a hard reset is not performed on RC integrator 1 to minimize impact on THD.

FIG. 4A shows various signals in response to application of a saturation recovery scheme in which RC integrator 3 undergoes a hard reset and a hold operation (e.g., no reset) is performed on RC integrator 4 in an example $4^{th}$-order loop filter in an example amplifier. FIG. 4A shows the differential input signal (DIFF INPUT) that is applied to the $4^{th}$-order loop filter, the output of the loop filter (FILTEROUT), the clamp reference voltage signal (Clamp Ref), as well as the output of each RC integrator 3 (I3_out) and RC integrator 4 (I4_out). Unlike prior art configurations, using the saturation recovery scheme of the present invention, the output signal remains below the 1% THD level at the rated power of 16 W, as shown in FIG. 4B.

Figure 5:
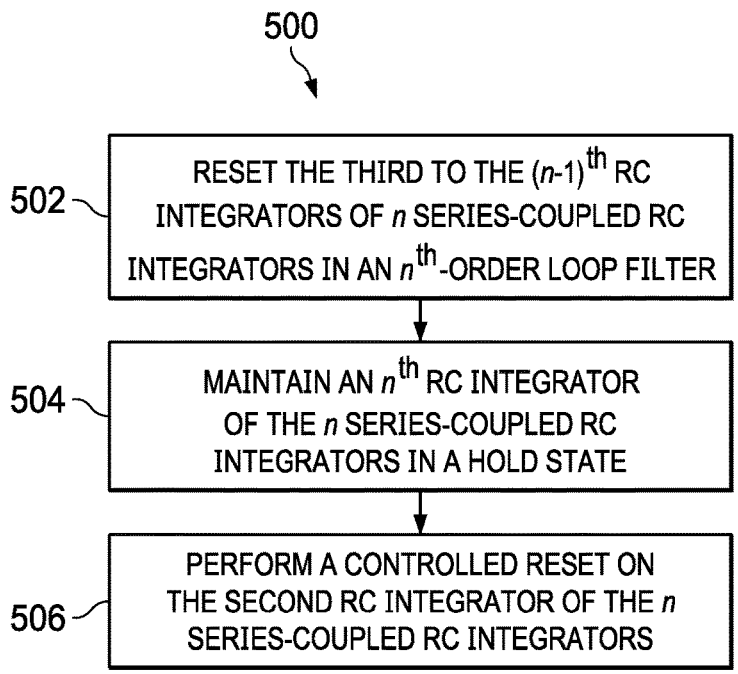
FIG. 5 is a flow diagram of an example method of operating an amplifier, and in particular, an $n^{th}$-order loop filter of a Class D amplifier, to recover from saturation.

FIG. 5 is a flow diagram of an example method 500 of operating an amplifier, and in particular, an $n^{th}$-order loop filter, e.g., loop filter 200, of a Class D amplifier, e.g., amplifier 100, in which loop filter 200 includes a series-coupled chain of n RC integrators. In an example, n is 4. In operation 502, the third RC integrator the $(n-1)^{th}$ RC integrator in the n chain of RC integrators is reset. In an example, operation 502 may entail closing a switch coupled in parallel with the integrating capacitor of each such RC integrator to completely discharge that capacitor, resulting in a hard reset. In operation 504, the $n^{th}$ RC integrator in the series is maintained in a hold state. In an example, operation 504 may entail not resetting the $n^{th}$ RC integrator. If a switch is coupled in parallel with the $n^{th}$ RC integrator, the path in which the switch is disposed should have a very high resistive component to essentially render the path an open circuit regardless of the position of the switch. In operation 506, a controlled reset is performed on the second RC integrator in the n series of RC integrators. In an example, operation 506 may involve closing a switch coupled in series with a damping control mechanism, e.g., a resistor, which combination is coupled in parallel with the integrating capacitor of the second of the n RC integrators, to control discharge of that capacitor. In an example, the first RC integrator of the n RC integrators is not reset.

Figure 6:
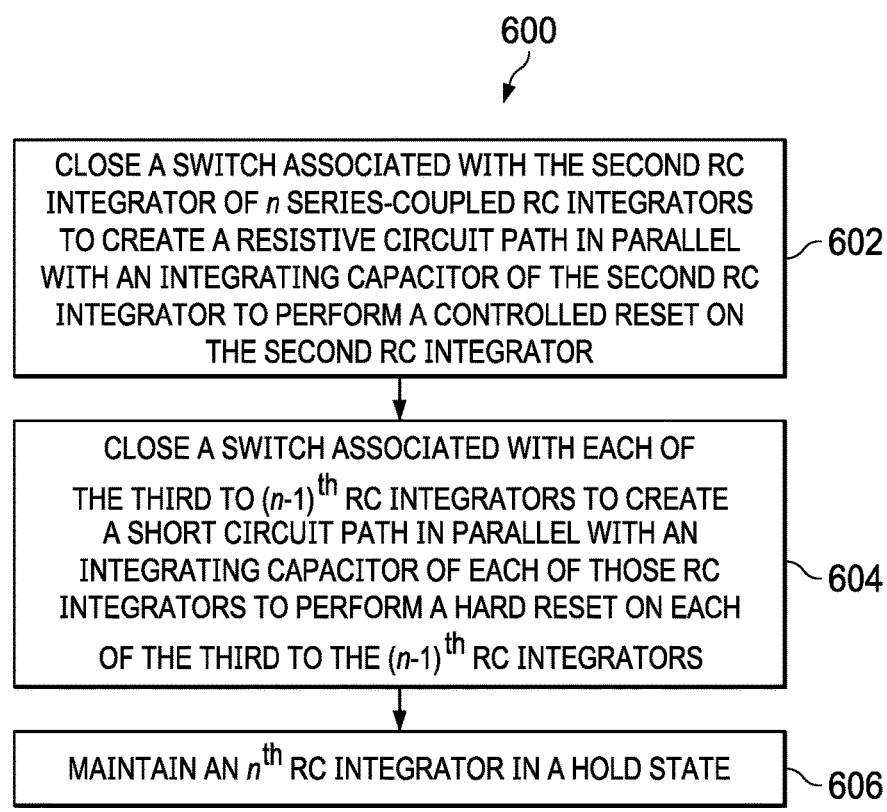
FIG. 6 is a flow diagram of an example method of operating an amplifier, and in particular, an $n^{th}$-order loop filter of a Class D amplifier, to recover from saturation.

FIG. 6 is a flow diagram of an example method 600 of operating an amplifier, and in particular, an $n^{th}$-order loop filter, e.g., loop filter 200, of a Class D amplifier, e.g., amplifier 100, in which loop filter 200 includes a series-coupled chain of n RC integrators. In an example, n is 4. In operation 602, a switch coupled in parallel with the integrating capacitor of the second RC integrator in the chain of n RC integrators is closed to create a resistive circuit path in parallel with that capacitor. The resistance is set to control the discharge of the integrating capacitor and thus control the reset of the second RC integrator. In operation 604, the third to $(n-1)^{th}$ RC integrator in the n series is hard reset, which involves closing a switch associated with each such RC integrator. The switch of each such RC integrator is in parallel with a corresponding integrating capacitor. Thus, the closing of each such switch creates a low resistance or short circuit path in parallel with the switch's corresponding capacitor to rapidly and completely discharge it. In operation 606, the $n^{th}$ RC integrator in the n series is maintained in a hold state. The hold operation may be a non-reset operation.

Each of FIGS. 5 and 6 depicts one possible set and order of operations. Not all operations need necessarily be performed in the order described. Some operations may be combined into a single operation. Some operations may be performed substantially simultaneously. Additional operations and/or alternative operations may be performed.

Generalizing for a structure of n series-coupled RC integrators, to achieve the sample-and-hold operation, no reset is performed on the first RC integrator, a controlled reset is performed on the second RC integrator which includes a damping control mechanism (e.g., RDAMP), a hard reset is performed on each of the third to the $(n-1)^{th}$ RC integrator, and the $n^{th}$ RC integrator is maintained in a hold state.

The example amplifiers and loop filters provide improved saturation recovery. In examples, such recovery is faster than that obtained with conventional techniques. In examples, such recovery is not only faster but maintains higher signal integrity. That is, the output signal is held below the 1% THD line at or near full power, e.g., 16 W. Such results may be obtained by implementing a hybrid sample-and-hold, second-order, loop-based saturation recovery with damping control to effectively recover the loop filter from sustained oscillations. In a $4^{th}$-order loop filter, resetting the third RC integrator along with not resetting the fourth RC integrator creates a sample-and-hold function at the output of the second RC integrator, on which a controlled reset is performed.

The term "couple" is used throughout the specification. The term and derivatives thereof may cover connections, communications, or signal paths that enable a functional relationship consistent with the description herein. For example, if device A provides a signal to control device B to perform an action, in a first example device A is coupled to device B, or in a second example device A is coupled to device B through intervening component C if intervening component C does not substantially alter the functional relationship between device A and device B such that device B is controlled by device A via the control signal provided by device A.

A device that is "configured to" perform a task or function may be configured (i.e., programmed and/or hardwired) at a time of manufacturing by a manufacturer to perform the function and/or may be configurable (or re-configurable) by a user after manufacturing to perform the function and/or other additional or alternative functions. The configuring may be through firmware and/or software programming of the device, through a construction and/or layout of hardware components and interconnections of the device, or a combination thereof.

A circuit or device that is described herein as including certain components may instead be adapted to be coupled to those components to form the described circuitry or device. For example, a structure described as including one or more semiconductor elements (such as transistors), one or more passive elements (such as resistors, etc.), and/or one or more sources (such as voltage and/or current sources) may instead include only the semiconductor elements within a single physical device (i.e. a semiconductor die and/or integrated circuit (IC) package) and may be adapted to be coupled to at least some of the passive elements and/or the sources to form the described structure either at a time of manufacture or after a time of manufacture, for example, by an end-user and/or a third-party.

The term "ground", if used herein, includes a power ground, a chassis ground, an Earth ground, a floating ground, a virtual ground, a digital ground, a common ground, and/or any other form of ground connection applicable to, or suitable for, the teachings of this description. Unless otherwise stated, "about," "approximately," or "substantially" preceding a value means+/−10 percent of the stated value.

Modifications of the described examples are possible, as are other examples, within the scope of the claims. Moreover, features described herein may be applied in other environments and applications consistent with the teachings provided.

What is claimed is:
1. An $n^{th}$-order loop filter, comprising:
an input configured to receive an input signal;
n resistor-capacitor (RC) integrators coupled in series, the second of the n RC integrators having a first type of reset mechanism, and each of the third RC integrator to the $(n-1)^{th}$ RC integrator of the n RC integrators having a second type of reset mechanism, wherein n is an integer of 4 or greater; and
a reset controller configured to output a reset signal to each of the first and second types of reset mechanisms when an overload condition is detected at the input.

2. The $n^{th}$-order loop filter of claim 1, wherein the first type of reset mechanism includes a switch and a resistor coupled across an input and an output of the second RC integrator of the n RC integrators, the switch of the first type of reset mechanism responsive to the reset signal.

3. The $n^{th}$-order loop filter of claim 2, wherein the second type of reset mechanism of each of the third RC integrator to the $(n-1)^{th}$ RC integrator includes a switch coupled across an input and an output of the corresponding RC integrator, each of the switches of the second type of reset mechanism responsive to the reset signal.

4. The $n^{th}$-order loop filter of claim 2, wherein the $n^{th}$ RC integrator of the n RC integrators is configured to not be reset in response to the reset signal, each of third RC integrator to the $(n-1)^{th}$ RC integrator is configured to be hard reset in response to the reset signal, and the second RC integrator of the n RC integrators is configured to be reset according to a resistance value of the resistor.

5. The $n^{th}$-order loop filter of claim 1, wherein the second RC integrator to the $(n-1)^{th}$ RC integrators of the n RC integrators are configured to be reset in response to the reset signal to implement a sample-and-hold function at an output of the second RC integrator.

6. The $n^{th}$-order loop filter of claim 1, wherein the overload condition occurs in a frequency range of approximately 20 kHz to approximately 40 kHz.

7. An amplifier comprising:
a loop filter including:
a first resistor-capacitor (RC) integrator having an input and an output, the input configured to receive an input signal;
a second RC integrator having an input and an output, the input of the second RC integrator coupled to the output of the first RC integrator;
a third RC integrator having an input and an output, the input of the third RC integrator coupled to the output of the second RC integrator;
a last RC integrator having an input and an output, the input of the last RC integrator coupled to an output of a second-to-last RC integrator;
a damping control mechanism coupled between the input and the output of the second RC integrator; and
reset mechanisms coupled between the input and the output of the third RC integrator to the second-to-last RC integrator, respectively; and
a reset controller configured to output a reset signal to the damping control mechanism and to the reset mechanisms when an overload condition is detected.

8. The amplifier of claim 7, wherein the damping control mechanism includes a switch and a resistor.

9. The amplifier of claim 8, wherein the switch and the resistor are coupled in series, and the series-coupled switch and resistor are coupled across the input and the output of the second RC integrator.

10. The amplifier of claim 7, wherein each of the reset mechanisms includes a switch coupled across the input and the output of the corresponding RC integrator.

11. The amplifier of claim 7, further comprising:
a summer having inputs coupled to the outputs of the RC integrators, respectively.

12. The amplifier of claim 11, wherein the reset controller includes a comparator having a reference signal input and summer signal input coupled to an output of the summer.

13. The amplifier of claim 7, wherein the overload condition occurs in a frequency range of approximately 20 kHz to approximately 40 kHz.

14. The amplifier of claim 7, wherein the third RC integrator is the second-to-last RC integrator.

15. A method of recovering from saturation in an $n^{th}$-order loop filter, the method comprising:
resetting each of a third resistor-capacitor (RC) integrator to an $(n-1)^{th}$ RC integrator of n series-coupled RC integrators in the $n^{th}$-order loop filter, wherein n is an integer of 4 or greater;
maintaining an $n^{th}$ RC integrator of the n series-coupled RC integrators in a hold state; and
performing a controlled reset on a second RC integrator of the n series-coupled RC integrators.

16. The method of claim 15, wherein the resetting of the each of the third RC integrator to the $(n-1)^{th}$ RC integrator of the n series-coupled RC integrators includes closing a switch coupled in parallel with an integrating capacitor of the corresponding RC integrator to create a short circuit path.

17. The method of claim 15, wherein the performing of the controlled reset on the second RC integrator of the n series-coupled RC integrators includes closing a switch coupled in series with a resistor, the switch and the resistor collectively coupled in parallel with an integrating capacitor of the second RC integrator to create a resistive circuit path.

18. The method of claim 15, wherein the maintaining operation includes closing a switch coupled in series with a resistor, the switch and the resistor collectively coupled in parallel with an integrating capacitor of the $n^{th}$ RC integrator to create a highly resistive or open circuit path.

19. A method of recovering from saturation in an $n^{th}$-order loop filter, the method comprising:
closing a switch of a second resistor-capacitor (RC) integrator of n series-coupled RC integrators in the $n^{th}$-order loop filter to create a resistive circuit path in parallel with an integrating capacitor of the second RC integrator, wherein n is an integer of 4 or greater;
closing a switch of each of a third RC integrator to an $(n-1)^{th}$ RC integrator of the n series-coupled RC integrators to create a short circuit path in parallel with an integrating capacitor of each of the third to the $(n-1)^{th}$ RC integrator; and
performing a hold operation on an $n^{th}$ RC integrator of the n series-coupled RC integrators.

* * * * *